(12) United States Patent
Hossain et al.

(10) Patent No.: US 11,929,339 B2
(45) Date of Patent: Mar. 12, 2024

(54) INNOVATIVE INTERCONNECT DESIGN FOR PACKAGE ARCHITECTURE TO IMPROVE LATENCY

(71) Applicant: Intel Corporation, Santa Clara, CA (US)

(72) Inventors: Md Altaf Hossain, Portland, OR (US); Ankireddy Nalamalpu, Portland, OR (US); Dheeraj Subbareddy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/300,329

(22) Filed: Apr. 13, 2023

(65) Prior Publication Data

US 2023/0352431 A1     Nov. 2, 2023

Related U.S. Application Data

(63) Continuation of application No. 17/466,396, filed on Sep. 3, 2021, now Pat. No. 11,658,144, which is a
(Continued)

(51) Int. Cl.
*G06F 13/38* (2006.01)
*G06F 13/14* (2006.01)
(Continued)

(52) U.S. Cl.
CPC .............. *H01L 24/18* (2013.01); *G06F 13/14* (2013.01); *G06F 13/385* (2013.01);
(Continued)

(58) Field of Classification Search
CPC .... G06F 13/385; G06F 13/4265; G06F 13/14; G06F 13/4221; H01L 24/18; H01L 25/0655; H01L 25/0652
See application file for complete search history.

(56) References Cited

U.S. PATENT DOCUMENTS 9,713,258 B2 * 7/2017 Kwark ................. H01L 25/165
10,461,146 B1 * 10/2019 Yeh ......................... H01L 24/32
(Continued)

*Primary Examiner* — Henry Tsai
*Assistant Examiner* — Christopher A Daley
(74) *Attorney, Agent, or Firm* — Fletcher Yoder, P.C.

(57) ABSTRACT

An integrated circuit includes a package substrate that includes first and second electrical traces. The integrated circuit includes first, second, third, and fourth configurable dies, which are mounted on the package substrate. The first and second configurable dies are arranged in a first row. The third and fourth configurable dies are arranged in a second row, which is approximately parallel to the first row. The first and third configurable dies are arranged in a first column. The second and fourth configurable dies are arranged in a second column, which is approximately parallel to the first column. The first electrical trace couples the first and third configurable dies, and the second electrical trace couples the second and third configurable dies. The second electrical trace is oblique with respect to the first electrical trace. The oblique trace improves the latency of signals transmitted between dies and thereby increases the circuit operating speed.

20 Claims, 12 Drawing Sheets

Related U.S. Application Data continuation of application No. 16/023,846, filed on Jun. 29, 2018, now Pat. No. 11,121,109.

(60) Provisional application No. 62/577,581, filed on Oct. 26, 2017.

(51) Int. Cl.
*G06F 13/42* (2006.01)
*H01L 23/00* (2006.01)
*H01L 25/065* (2023.01)

(52) U.S. Cl.
CPC ...... *G06F 13/4221* (2013.01); *G06F 13/4265* (2013.01); *H01L 25/0652* (2013.01); *H01L 25/0655* (2013.01)

(56) References Cited

U.S. PATENT DOCUMENTS

| | | |
|---|---|---|
| 10,552,353 B1 | 2/2020 | Farjadrad |
| 2019/0067248 A1 | 2/2019 | Yoo et al. |
| 2022/0059491 A1* | 2/2022 | Hossain .................. H01L 24/18 |

* cited by examiner

INNOVATIVE INTERCONNECT DESIGN FOR PACKAGE ARCHITECTURE TO IMPROVE LATENCY

CROSS-REFERENCE TO RELATED APPLICATIONS

This application is a continuation of U.S. patent application Ser. No. 17/466,396, filed Sep. 3, 2021, which is a continuation of U.S. patent application Ser. No. 16/023,846, filed Jun. 29, 2018, which issued as U.S. Pat. No. 11,121,109 on Sep. 12, 2021, and which claims the benefit of U.S. Provisional Patent Application No. 62/577,581, filed Oct. 26, 2017, each of which is incorporated by reference herein.

FIELD OF THE DISCLOSURE

The present disclosure relates to integrated-circuit packaging. More specifically, the present disclosure relates to a multi-chip package where improved integrated circuit (IC) performance is facilitated by a diagonal trace arrangement in the package.

BACKGROUND OF THE INVENTION

Integrated-circuit packaging has evolved from housing a single IC die in a package to housing and interconnecting a number of dies to form system-in-package (SiP) devices. SiP devices are often highly integrated semiconductors that combine a number of IC dies of various functionality, various processing generations, and various manufacturing processes, all within a single package. The IC dies combined in a SiP often form a system or subsystem for an electronic device.

SiP devices not only reduce the footprint of IC dies housed in a single package as compared to discretely packaged ICs mounted on a printed circuit board (PCB) but also shorten the distances that electrical signals travel between IC dies housed by the SiP as compared to discretely packaged ICs mounted on a PCB and interconnected by the PCB.

Thereby, SiP devices facilitate faster operations of a system or subsystem formed by the SiP device as compared to a system or subsystem of discretely packaged ICs mounted on a PCB. SiPs also facilitate faster operations in a relatively small footprint compared to a system or subsystem of discretely packaged ICs mounted on a PCB. However, an impetus remains to continue to improve the operating speeds of SiP devices and various embodiments described in this description are directed toward further improving the performance of SiP devices via the arrangement of various components of a multi-chip package.

DETAILED DESCRIPTION OF THE INVENTION

System-in-package (SiP) devices, such as SiP devices that provide system and subsystem architectures of electronic devices, continue to fuel development in integrated circuit (IC) markets. Circuit emulation markets and data center markets are two of the developing IC markets fueled by SiP devices. SiP devices directed toward circuit emulation markets often include a number of configurable ICs to facilitate an almost unlimited number of emulated circuits. SiP devices directed toward data center markets facilitate acceleration of functions in the data center.

Configurable ICs included in these SiP devices may include field programmable gate arrays (FPGAs), programmable logic devices (PLDs), complex programmable logic devices (CPLDs), programmable logic arrays (PLAs), configurable logic arrays (CLAs), and other ICs. Configurable ICs typically include a number of configurable logic blocks that may be configured to implement various circuit emulations. The logic blocks are interconnected by configurable interconnect structures that may be programmed to interconnect the logic blocks in almost any desired configuration to provide almost any desired circuit emulation.

SiP devices that are directed toward circuit emulation markets, data center markets, and other markets are typically designed and manufactured for low signal-transfer time for relatively fast die-to-die communications. Signal-transfer time is sometimes referred to as latency. Reducing the number of times a signal is passed from a first die, through one or more intermediary dies, to an intended die may improve the latency of a transmitted signal. Latency may be reduced not only by reducing the path length a signal travels through intermediary dies, but may also be reduced by eliminating the latency associated with routing decisions made by the intermediary dies. Embodiments described herein are directed toward reducing signal latency and toward other IC improvements.

Figure 1:
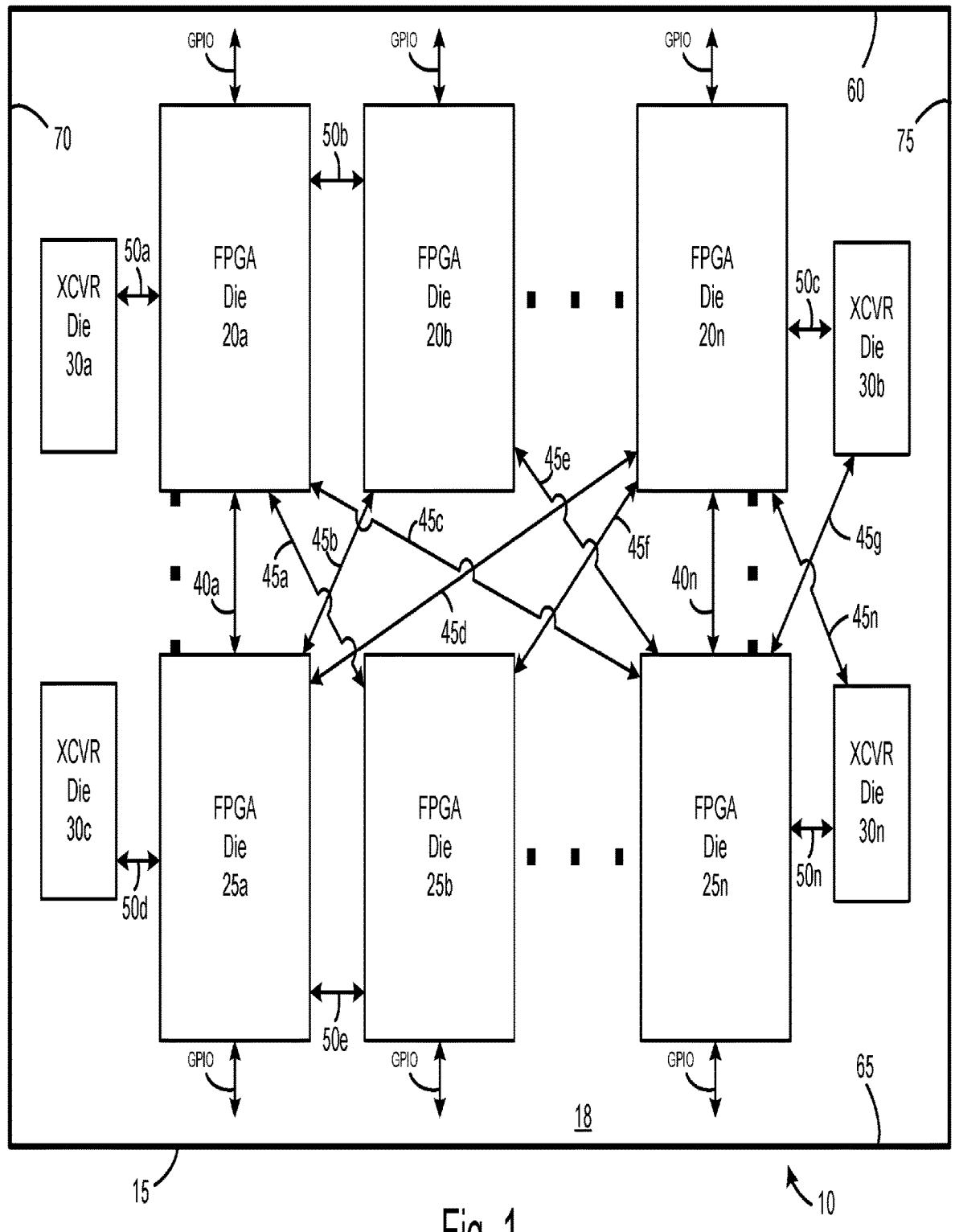
FIG. 1 illustrates a top view of a semiconductor device that includes an IC package where the package houses a number of IC dies, in an embodiment.

FIG. 1 illustrates a top view of a semiconductor device 10 that includes an IC package 15 that houses a number of IC dies, in an embodiment. For clarity, the top view of the semiconductor device shows the device without a top and with the die visible in the package. The semiconductor device may be a SiP device, a multi-chip module, a multi-die assembly, a system-on-package device, and other multi-die devices.

IC package 15 includes a package substrate 18 on which the dies are mounted. The package substrate may be formed of a variety of substrate materials, such as a silicon substrate or an organic substrate formed of FR4, FR5, FR6, or other organic substances. Both silicon substrates and organic substrates may have metal layers formed in the substrates. In an embodiment, IC package 15 is a 2D IC package where the package includes an organic substrate 18 on which IC dies are mounted. The package substrate may be a silicon substrate, such as an active or passive silicon substrate. The silicon substrate (e.g., a silicon interposer) may be electrically and mechanically connected to an organic substrate. The silicon substrate and the organic substrate to which the package substrate is connected (e.g., via reflowed solder connections) may form a 2.5D IC package.

The package substrate (e.g., an organic substrate) may include one or more electrical interconnect bridges, such as silicon interconnect bridges, inset into the substrate. Silicon interconnect bridges include electrical traces formed in the silicon that connect to the electrical connectors (e.g., solder bumps, solder balls, pins, or others interconnects, generally referred to as bumps) of the IC dies mounted on the package substrate. One example of an electrical interconnect bridge that may be positioned in package substrate 18 is an embedded multi-die interconnect bridge (EMIB) element described in U.S. Pat. Nos. 8,946,900 and 9,240,377. Interconnect bridges are sometimes referred to herein as interposer bridges.

The IC dies mounted on package substrate 18 may include one or more types of dies. The IC dies may include digital circuit dies, analog circuit dies, mixed signal circuit dies, or any combination of these types of dies. The dies may be arranged in one or more rows, one or more columns, or both. For example, the dies may be arranged in 1, 2, 3, 4, 5, 6, 7, 8, 9, 10 or more rows (e.g., indicated by the vertically arranged ellipses in FIG. 1), 1, 2, 3, 4, 5, 6, 7, 8, 9, 10 or more columns (e.g., indicated by the horizontally arranged ellipses in FIG. 1), or both.

In a specific embodiment, the dies include a number of FPGA dies (e.g., dies 20a, 20b . . . 20n and 25a, 25b . . . 25n) and a number of transceiver dies (i.e., XCVR) (e.g., 30a, 30b, 30c . . . 30n). The FPGA dies may include any number of dies, such as 1, 2, 3, 4, 5, 6, 7, 8, 9, 10 or more. The FPGA dies may be arranged in one or more rows, one or more columns, or both.

The input-output (IO) elements (e.g., solder bumps, solder balls, pins, or interconnect elements) of two or more of the dies are electrically connected by a number of electrical traces, such as electrical traces 40a . . . 40n, 45a, 45b, 45c, 45d, 45e, 45f, 45g . . . 45n, and 50a, 50b, 50c, 50d, 50e . . . 50n. The electrical traces may be formed in package substrate 18. Electrical traces in the package substrate are sometimes referred to as on-package IOs (i.e., OPIOs). The electrical traces are arranged in one or more vertically arranged layers in the package substrate.

In an embodiment, the IO elements of various dies are also connected to general purpose IO (GPIO) traces in the package substrate where the GPIO traces may be connected to IOs (e.g., ball grid array) of the IC package 15.

The electrical traces may be arranged in a number of directions in the substrate. For example, the traces may be oriented in a vertical direction (e.g., direction between top and bottom 60 and 65 and perpendicular to left and right sides 70 and 75), a horizontal direction (e.g., direction between left and right sides 70 and 75 and perpendicular to top and bottom 60 and 65), or one or more oblique directions. The oblique directions are oblique with respect to the vertical and horizontal directions. That is, the oblique directions are neither parallel nor perpendicular to the vertical direction and neither parallel nor perpendicular to the horizontal direction. In an embodiment, electrical traces 40a-40n are in the vertical direction, electrical traces 50a-50n are in the horizontal direction, and electrical traces 45a-45n are in the oblique directions.

In an embodiment, the electrical traces along the oblique directions connect dies that are diagonally positioned with respect to each other. Diagonally positioned dies are dies that are in different rows of dies and in different columns of dies. The electrical traces along the oblique directions may connect the IO elements (e.g., solder bumps, solder balls, pins, or other IO elements) of dies where the IO elements are diagonally positioned with respect to each other. Diagonally positioned IO elements are elements that are in different rows of IO elements and in different columns of IO elements.

An oblique trace may connect a single die in a row of dies and a column of dies to any other die in a different row of dies and in a different column of dies. Further, multiple oblique traces may connect a single die in a row of dies and a column of dies to multiple dies in multiple different rows and multiple different columns of dies. For example, die 25n is connected to three diagonally positioned dies 20a, 20b, and 30b by electrical traces 45c, 45e, and 45g. One benefit of connecting a given die in a row and column to any other die, via an oblique trace, in a different row and different column of dies is that multiple hops of a signal through multiple electrical traces are eliminated and multiple traverses of the signal through one or more other dies (other than the initial transmitting die and intended final recipient die) is eliminated. The elimination of multiple hops of a signal through numerous electrical traces and through numerous other dies increases the processing speed of multi-die packages, such as SiPs. In a system (e.g., including one or more SiPs with multiple FPGA dies) that may potentially include numerous dies (e.g., more than two dies, such as numerous FPGA dies), the use of oblique traces may increase the processing speed of such a system, such that new applications are possible that previously were not possible.

In an embodiment, electrical traces that are oriented in two different oblique directions, cross over and under each other in different layers of the package substrate. The traces connect diagonally positioned dies or diagonally positioned IO elements of dies. These electrical traces are sometimes referred to as cross traces. For example, electrical traces 45g and 45n are oriented in two different oblique directions, cross over and under each other in different layers of the package substrate, and connect diagonally positioned dies.

Trace 45g connects diagonally positioned die 25n and die 30b, and trace 45n connects diagonally positioned die 20n and die 30n. Further, in the example embodiment shown in FIG. 1, electrical traces 45a and 45b are cross traces, electrical traces 45a and 45d are cross traces, electrical traces 45b and 45c are cross traces, electrical traces 45c and 45d are cross traces, electrical traces 45c and 45f are cross traces, electrical traces 45d and 45e are cross traces, and electrical traces 45e and 45f are cross traces. Vertical electrical traces and oblique electrical traces may also be cross traces, and horizontal electrical traces and oblique electrical traces may also be cross traces.

Figure 2:
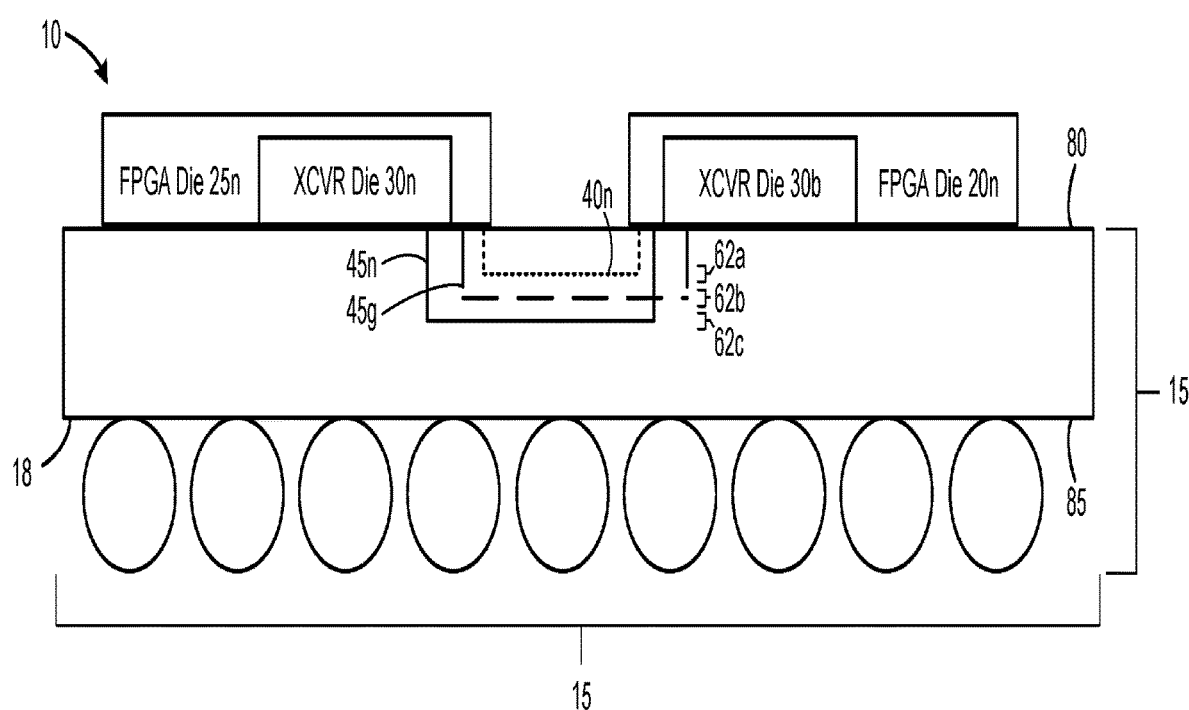
FIG. 2 illustrates a cross-sectional view of the semiconductor device and shows three electrical traces that are included in an internal portion of a package substrate of the device, in an embodiment.

FIG. 2 illustrates a cross-sectional view of a semiconductor device 10 shown in FIG. 1, in an embodiment. The cross-section of the view of FIG. 2 is through dies 30b and 30n as shown in FIG. 1. FIG. 2 shows three electrical traces 40n, 45g, and 45n included in the internal portion of package substrate 18. Other electrical traces shown in FIG. 1 are not shown in the cross-sectional view for clarity.

The electrical traces in the substrate are connected to the top surface of the substrate by vertical vias formed in the package substrate. The vias may be plated with a conductive material. In an implementation, the vertical vias are considered portions of the electrical traces. The electrical traces may include copper or other conductive material. The cross-sectional view of the semiconductor devices shows cross traces 45g and 45n in layers 62b and 62c, respectively, and shows trace 40n in layer 62a. While layer 62a is shown above layers 62b and 62c, the layers may be in arranged in any alternative vertical ordering.

Further, a layer of electrical traces may include electrical traces that are arranged in one or more of the described trace directions, such as vertical, horizontal, or oblique. That is, a layer of electrical traces may include one or more vertical electrical traces, one or more horizontal electrical traces, one or more oblique electrical traces, or any combination of these electrical traces.

The package substrate may include one or more layers of electrical traces. For example, the package substrate may include 1, 2, 3, 4, 5, 6, 7, 8, 9, 10, 11, 12, 13, 14, 15, or more layers of electrical traces. In a specific embodiment, package substrate 18 includes four layers of vertical electrical traces, four layers of horizontal electrical traces, and four layers of electrical traces that are in oblique directions. These layers may have any vertical arrangement between upper surface 80 and lower surface 85. For example, a first layer of electrical traces (e.g., a top layer of traces closest to upper surface 80) may include vertical electrical traces, a second layer of electrical traces below the first layer of electrical traces may include horizontal electrical traces, a third layer of electrical traces below the second layer of electrical traces may be oblique electrical traces, and subsequent layers of electrical traces may repeat this pattern of vertical, horizontal, and oblique electrical traces. The layers of electrical traces may have any other arrangement of vertical, horizontal, and oblique electrical traces. In an embodiment, the layers of electrical traces may be arranged for low or minimal vertical overlap of electrical traces to facilitate low cross-talk between the traces.

Further, various layers of ground planes or partial ground planes may be positioned above, below, or in between the layers of electrical traces to facilitate controlled (e.g., approximately constant) resistance to ground. The controlled use of ground planes and other properties of the electrical traces (e.g., distance between traces) lower signal reflections and signal cross-talk.

Oblique electrical traces and oblique electrical traces that cross provide a number of benefits. An oblique electrical trace that connects two diagonally arranged dies allows for a signal to be directed from a source die to a target die in a single traverse (i.e., single hop) of a single electrical trace. In contrast, in a package substrate that includes vertical and horizontal traces, but does not include oblique traces, at least two signal traces link diagonally arranged die via at least one intermediary die. For example, a source die may electrically connect to a vertically positioned die by a vertical electrical trace (e.g., first hop trace), and the vertically positioned die may link to a diagonally positioned die (diagonally positioned with respect to the source die) via a horizontal electrical trace (e.g., second hop trace). The two hops of a signal from the source die to the diagonally positioned die along the vertical and horizontal traces take temporally longer than a single hop along an oblique trace from the source die to the diagonally positioned die. Not only is a shorter trace length provided by the oblique trace as compared to a vertical trace and a horizontal trace, but the routing time through the intermediary die and the processing time of the intermediary die for determining a subsequent die to route the signal to is also eliminated, thereby further reducing the time a signal takes to traverse from the source die to the diagonally positioned die. Thereby, oblique traces allow multi-chip semiconductor devices to operate at higher operating speeds than traditional multi-chip semiconductor devices that do not include oblique traces connecting diagonally arranged dies. For example, using an oblique trace in place of a vertical trace and a horizontal trace to connect two dies may decrease the latency of signal transmission by 50 percent or more compared to traditional multi-chip semiconductor devices.

Figure 3:
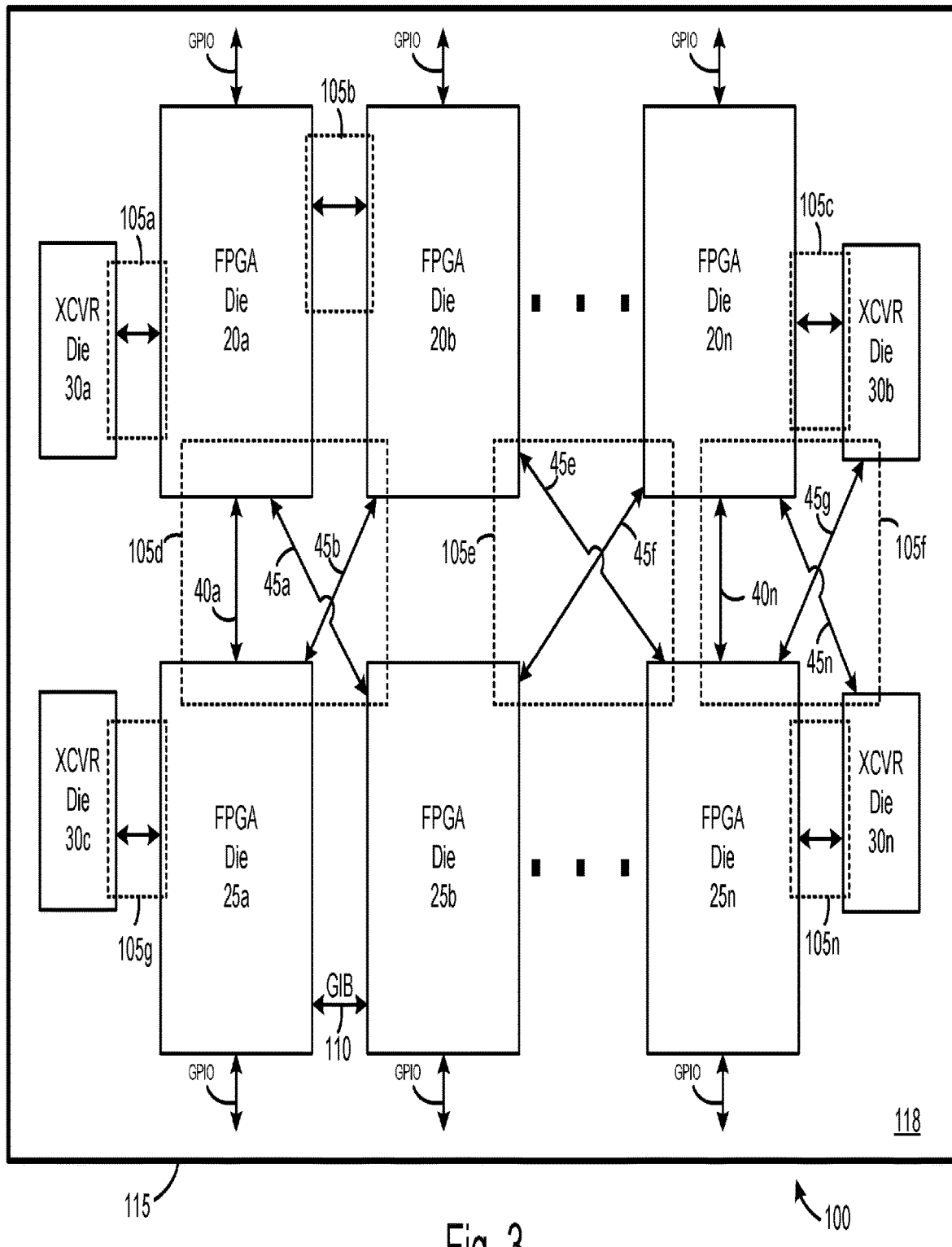
FIG. 3 illustrates a top view of a semiconductor device that includes an IC package that houses a number of IC dies that are connected by one or more bridge elements, such as embedded multi-die interconnect bridge (EMIB) elements, in an embodiment.

FIG. 3 illustrates a top view of a semiconductor device 100 that includes an IC package 115 that houses a number of IC die, in an embodiment. For clarity, the top view of the semiconductor device shows the device without a top and with the die visible in the package. The semiconductor device may be a SiP device, a multi-chip module, a multi-die assembly, a system-on-package device, and other multi-die devices.

Semiconductor device 100 is similar to semiconductor device 10, but differs in that semiconductor device 100 includes one or more interconnect bridges, such as EMIB elements 105a, 105b, 105c, 105d, 105e, 105f, 105g . . . 105n. A top view of the top-lateral planes of the interconnect bridges is shown in FIG. 3. The interconnect bridges are positioned in package substrate 118. Each interconnect bridge includes one or more electrical traces (e.g., electrical traces formed in the silicon substrate of an EMIB element) that connect two or more dies. The electrical traces in each of the interconnect bridges may include one or more vertical electrical traces, one or more horizontal electrical traces, one or more oblique electrical traces, or any combination of these electrical traces. For example, in package substrate 118 of semiconductor device 100, EMIB element 105d includes electrical traces 40a, 45a, and 45b, EMIB element 105e includes electrical traces 45e and 45f, EMIB element 105f includes electrical traces 40b, 45g, and 45n, and EMIB elements 105a, 105b, 105c, 105g and 105n that connect various dies included in IC package 115.

In an embodiment, a package substrate that includes interconnect bridges to connect the dies in the package also includes electrical traces in the package substrate itself to connect at least two dies. For example, general purpose interconnect bridge (GIB) 110 may include one or more electrical traces that are formed in the package substrate (e.g., to connect solder bumps of dies 25a and 25b). Further, the general purpose IOs (GPIOs) may include electrical traces that are formed in the package substrate.

Figure 4:
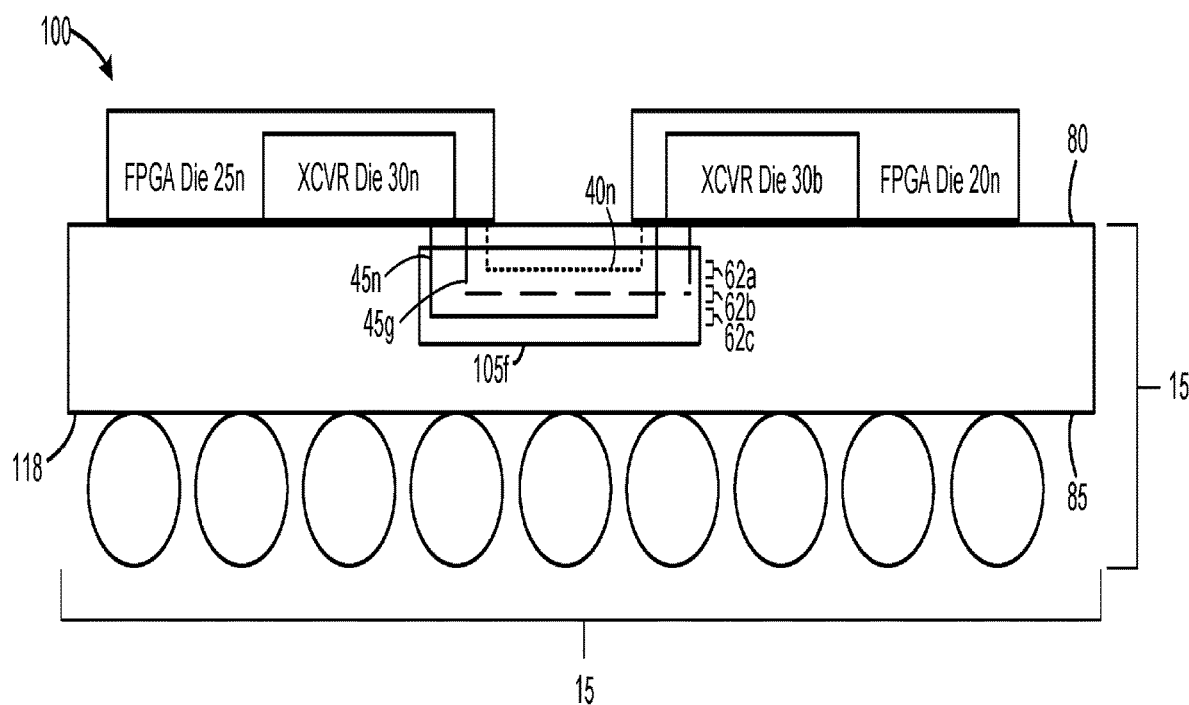
FIG. 4 illustrates a cross-sectional view of the semiconductor device and shows the three electrical traces that are included in a bridge element, in an embodiment.

FIG. 4 illustrates a cross-sectional view of semiconductor device 100 that is illustrated in FIG. 3. The cross-section of the view of FIG. 4 is through dies 30b and 30n as shown in FIG. 3. The cross-sectional view shows three electrical traces 40n, 45g, and 45n included in interconnect bridge 105e, in an embodiment. An edge-on view of the top-lateral plane of the interconnect bridges is shown in FIG. 4. Other electrical traces are not shown in the cross-sectional view for clarity.

The electrical traces in the interconnect bridges are connected to the top surface of package substrate 418 by vertical electrical traces formed in the package substrate and in the interconnect bridges. The cross-sectional view of the semiconductor device shows cross traces 45g and 45n in layers 62b and 62c and shows electrical trace 40n in layer 62a. While layer 62a, which includes electrical trace 40n, is shown above layers 62b and 62c, which respectively include electrical traces 45g and 45n, the electrical traces may be in arranged in any alternative vertical orderings among the layers.

An interconnect bridge may include one or more layers of electrical traces in various embodiments. For example, an EMIB element may include 1, 2, 3, 4, 5, 6, 7, 8, 9, 10, 11, 12, 13, 14, 15, or more layers of electrical traces.

In a specific embodiment, an interconnect bridge includes four layers of vertical electrical traces, four layers of horizontal electrical traces, and four layers of electrical traces that are in oblique directions. These layers may have any vertical arrangement in the interconnect bridge. For example, a first layer of electrical traces (e.g., a top layer of electrical traces closest to upper surface 80) may include vertical electrical traces, a second layer of electrical traces below the first layer of electrical traces may include a horizontal electrical traces, a third layer of electrical traces below the second layer of electrical traces may include oblique electrical traces, and subsequent layers of electrical traces may repeat this pattern of vertical, horizontal, and oblique electrical traces. The layers of electrical traces may have any other arrangement of vertical, horizontal, and oblique electrical traces. In an embodiment, the layers of electrical traces may be arranged for low or minimal vertical overlap of electrical traces to facilitate low cross-talk between the electrical traces.

Further, various layers of ground planes or partial ground planes may be positioned above, below, or in between the layers of electrical traces to facilitate controlled (e.g., approximately constant) resistance to ground. The controlled use of ground planes and other properties of the electrical traces (e.g., distance between traces, trace widths, etc.) lower signal reflections in electrical traces.

An EMIB element allows for a relatively high density of electrical traces in the EMIB element to connect the dies. Similar to the oblique electrical traces in the package substrate, the oblique electrical traces in the EMIB element allow for a relatively small number of electrical traces (e.g., one electrical trace or one hop) between two diagonally positioned dies, which facilitates increased operation speeds of the semiconductor device.

In an embodiment, at least one EMIB element is oriented in the package substrate so that the sides of the EMIB elements are obliquely oriented with respect to the vertical and horizontal electrical traces within the element. In a specific implementation, the sides of the EMIB element are angled at approximately 45 degrees with respect to the vertical and horizontal electrical traces. In another specific implementation, at least two sides (e.g., opposite sides) of the EMIB element are approximately parallel with at least one of the oblique electrical traces that is within the EMIB element.

Figure 5:
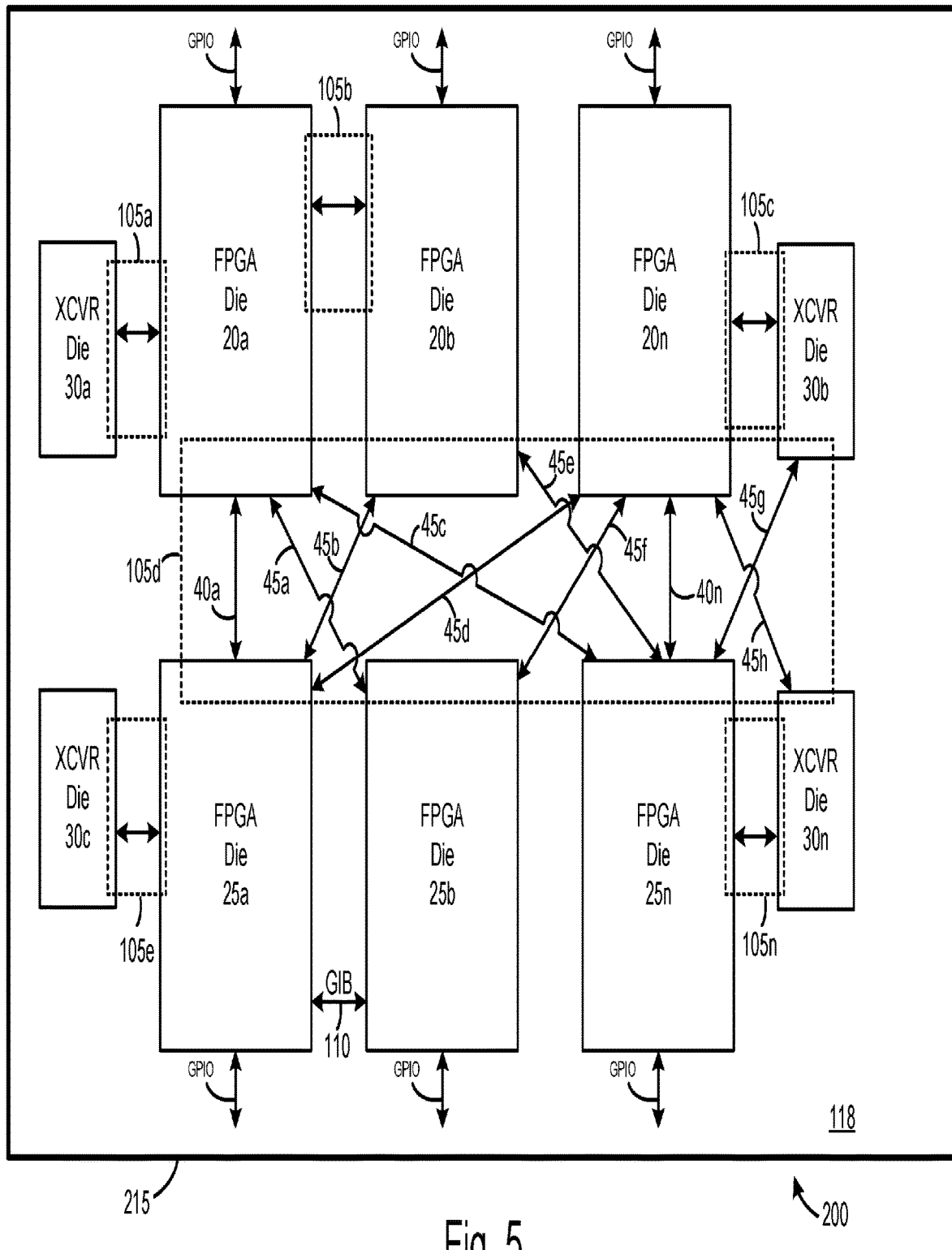
FIG. 5 illustrates a top view of a semiconductor device that includes an IC package that houses a number of IC dies that are connected by one or more bridge elements, in an embodiment.

FIG. 5 illustrates a top view of a semiconductor device 200 that includes an IC package 215 that houses a number of IC die, in an embodiment. For clarity, the top view of the semiconductor device shows the device without a top and with the die visible in the package. The semiconductor device may be a SiP device, a multi-chip module, a multi-die assembly, a system-on-package device, and other multi-die devices.

Semiconductor device 200 is similar to semiconductor device 100, but differs in that semiconductor device 200 includes an extended interconnect bridge (e.g., an extended EMIB element) 105d that extends between dies in two rows of dies. The interconnect bridge may extend between all of the dies in the two rows of dies or may extend between a portion of the dies in the two rows. In an alternative embedment, the interconnect bridge extends between all of the dies in two columns of dies or between a portion of the dies in two columns of dies. In another alternative embodiment, the interconnect bridge may extend between portions of rows of dies and portion of columns of dies.

An interconnect bridge, which is positioned between dies in two rows of dies, includes electrical traces that connect two or more dies in the two rows of dies, and an interconnect bridge that is positioned between dies in two columns of dies, includes electrical traces that connect two or more dies in the two columns of dies. The electrical traces in the extended interconnect bridge include vertical electrical traces, horizontal electrical traces, oblique electrical traces, or any combination of vertical, horizontal, and oblique electrical traces. The interconnect bridge may also include cross traces.

Figure 6:
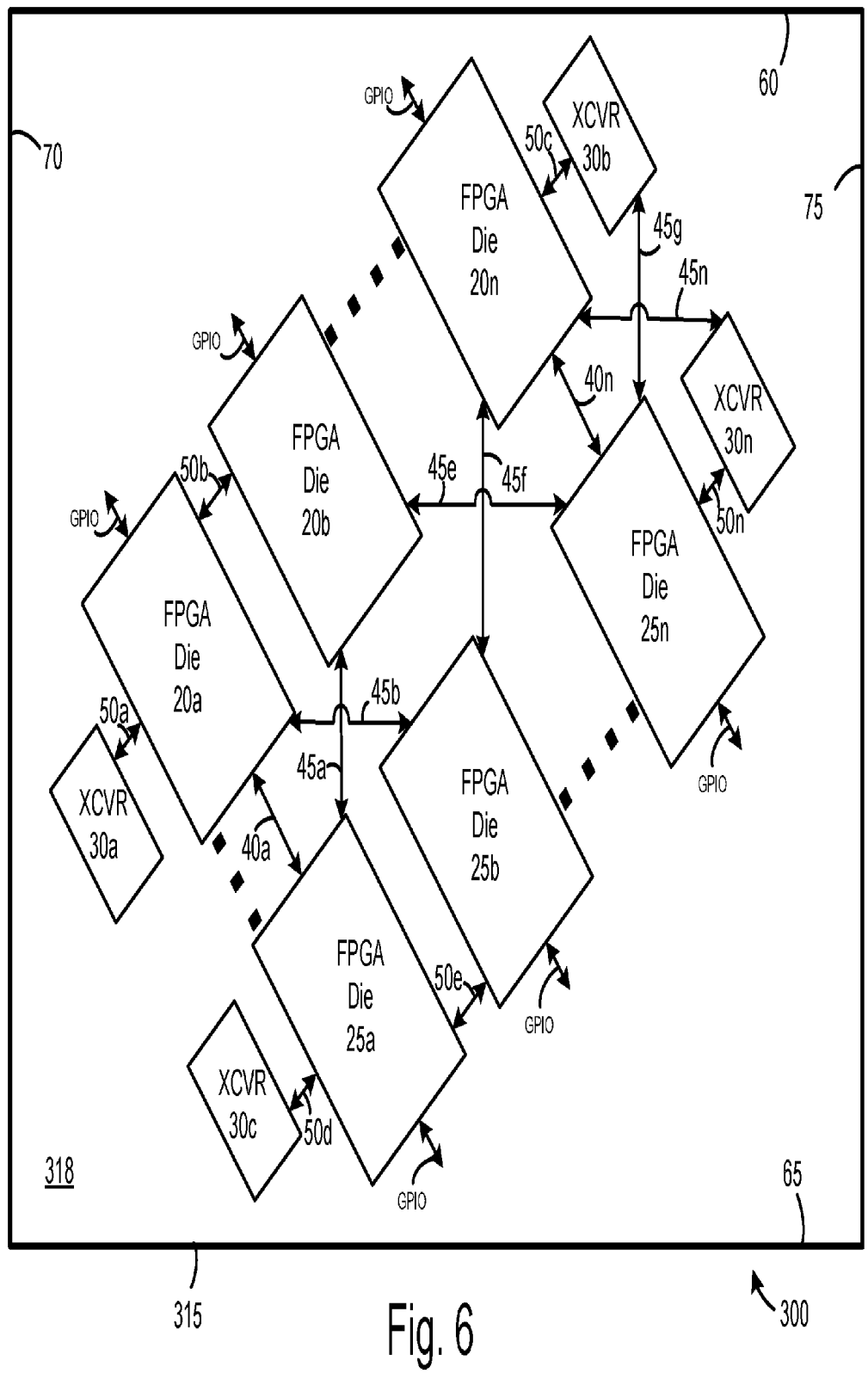
FIG. 6 illustrates a top view of a semiconductor device that includes an IC package that houses a number of IC dies where rows of dies and columns of dies are obliquely oriented with respect to the sides of the IC package, in an embodiment.

FIG. 6 illustrates a top view of a semiconductor device 300 that includes an IC package 315 that houses a number of IC die, in an embodiment. The top view of the semiconductor device shows the device without a top and with the die visible in the package. The semiconductor device may be a SiP device, a multi-chip module, a multi-die assembly, a system-on-package device, and other multi-die devices.

Semiconductor device 300 is similar to semiconductor devices 10, 100, and 200 but differs in that semiconductor device 300 includes rows and columns of dies that are obliquely oriented (e.g., not perpendicularly oriented) with respect to the sides 60, 65, 70, and 75 of the package substrate. The dies are also in rotated positions with respect to the sides of the package substrate in comparison to semiconductor devices 10, 100, and 200. That is, the sides of the dies are obliquely oriented (e.g., not perpendicularly oriented) with respect to the sides of the package substrate. The longitudinal axis of each row and column of dies may be angled between 0 degrees and 90 degrees from a perpendicular orientation with respect to the sides of the package substrate. The dies may be similarly angled (e.g., between 0-90 degrees) with respect to the side of the package substrate. That is, the sides of the dies may be obliquely angled with respect to the sides 60, 65, 70, and 75 of the package substrate.

Electrical traces 40a-40n and 50a-50n are also obliquely oriented (e.g., angled between 0 degrees and 90 degrees) with respect to the sides of the package substrate. Electrical traces 45a-45n may be referred to herein as the oblique electrical traces where these oblique electrical traces are oblique with respect to electrical traces 40a-40n and 50a-50n.

In an embodiment, the oblique electrical traces are approximately perpendicular, approximately parallel, or both with respect to sides 60, 65, 70, and 75 of the package substrate. The electrical traces 40a-40n and 50a-50n are angled with respect to sides 60, 65, 70, and 75 of the package substrate by approximately 45 degrees. Two or more of the oblique electrical traces may be cross traces.

The oblique electrical traces may be OPIO traces, EMIB traces, other IO types of traces, or any combination of these trace types. The vertical electrical traces may be OPIO traces, EMIB traces, other IO types of traces, or any combination of these trace types. The horizontal electrical traces may be OPIO traces, EMIB traces, other IO types of traces, or any combination of these trace types.

In an embodiment, an EMIB element that includes oblique electrical traces may have sides that are parallel to the vertical and horizontal electrical traces or that are obliquely oriented (e.g., at 45 degrees) with respect to the vertical and horizontal electrical traces (e.g., two sides approximately parallel to one or more of the oblique electrical traces).

Figure 7:
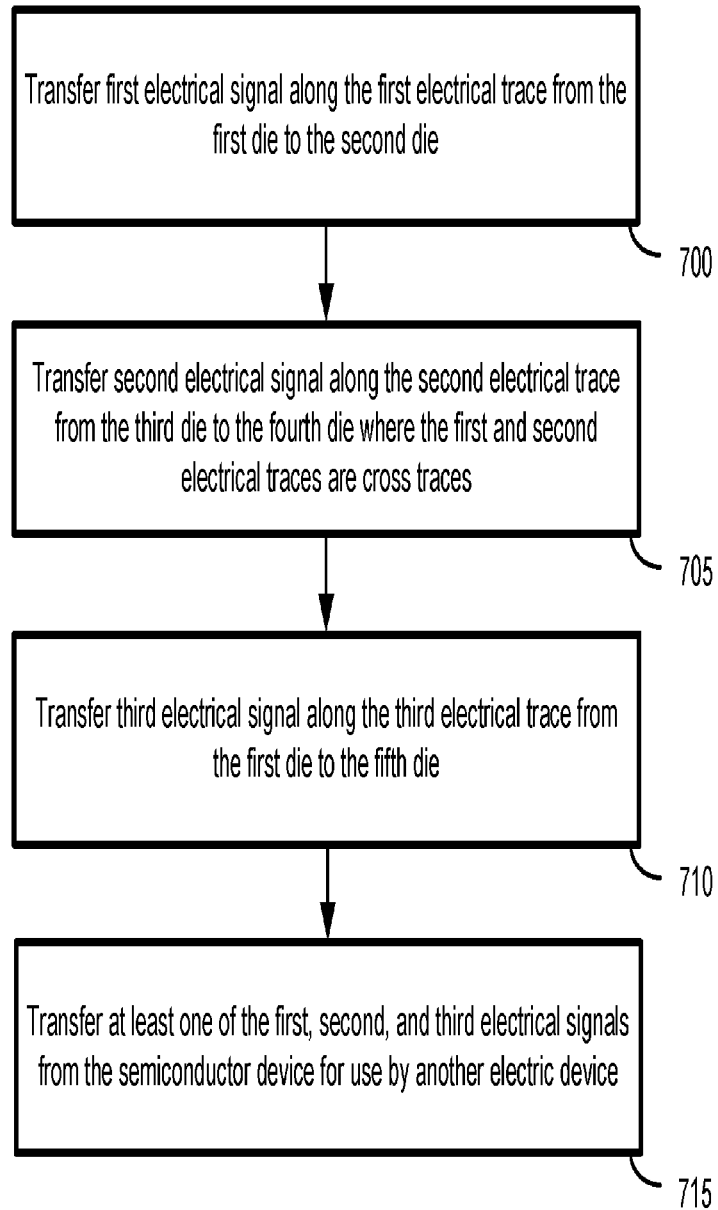
FIG. 7 is a flow diagram of a method of operation of a semiconductor device having one or more oblique traces, in an embodiment.

FIG. 7 is a flow diagram of a method of operation of a semiconductor device having one or more oblique electrical traces, in an embodiment. The flow diagram represents one example embodiment. Steps may be added to, removed from, or combined in the flow diagram without deviating from the scope of the embodiment.

At 700, a first oblique electric trace connects a first die and a second die that are located on a package substrate of a multi-die semiconductor device, such as a SiP. The first and second dies are located on the package substrate and are located in a first row and a second row of dies, respectively, and in a first column and a second column of dies, respectively. The first and second rows are different rows and the first and second columns are different columns. The first oblique electrical trace may be located in the package substrate, in an EMIB element, or other structure of the semiconductor device. A first electrical signal is transmitted from the first die to the second die along the first oblique electrical trace.

At 705, a second oblique electric trace connects a third die and a fourth die that are located on the package substrate. The third and fourth dies are located in the first row and the second row of dies, respectively, and in the first column and the second column of dies, respectively. The second oblique electrical trace may be located in the package substrate, in an EMIB element, or other structure of the semiconductor device. A second electrical signal is transmitted from the third die to the fourth die along the second oblique electrical trace.

The first and second oblique electrical traces may be in a first layer of electrical traces and a second layer of electrical traces respectively where the first and second layers are different layers. The first layer of electrical traces may be located above the second layer of electrical traces. At least a portion of the second oblique electrical trace may be positioned under the first electrical trace, such that the first and second electrical traces cross as viewed from a top view of the electrical traces (e.g., view of the devices shown in FIGS. 1, 3, 5, and 6).

At 710, a third oblique electric trace connects a first die and a fifth die that are located on the package substrate. The first and fifth dies are located in the different rows and different columns of dies on the package substrate. The third oblique electrical trace may be located in the package substrate, in an EMIB element, or other structure of the semiconductor device. A third electrical signal is transmitted from the first die to the fifth die along the third oblique electrical trace.

The first, second, and third electrical signals may be propagated through the dies and processed by the dies to perform various processing steps on the signals. One or more of the signals may be transmitted from one or more of the dies externally from the package for use by other circuit devices connected to the semiconductor device, step 715.

While the example embodiments described above include a single electrical trace linking two dies, multiple electrical traces may link two dies. For example, one or more oblique electrical traces may link two diagonally positioned dies (two dies in different rows and different columns). One or more vertical electrical traces may link two dies. Also, one or more horizontal electrical traces may link two dies.

Figure 8:
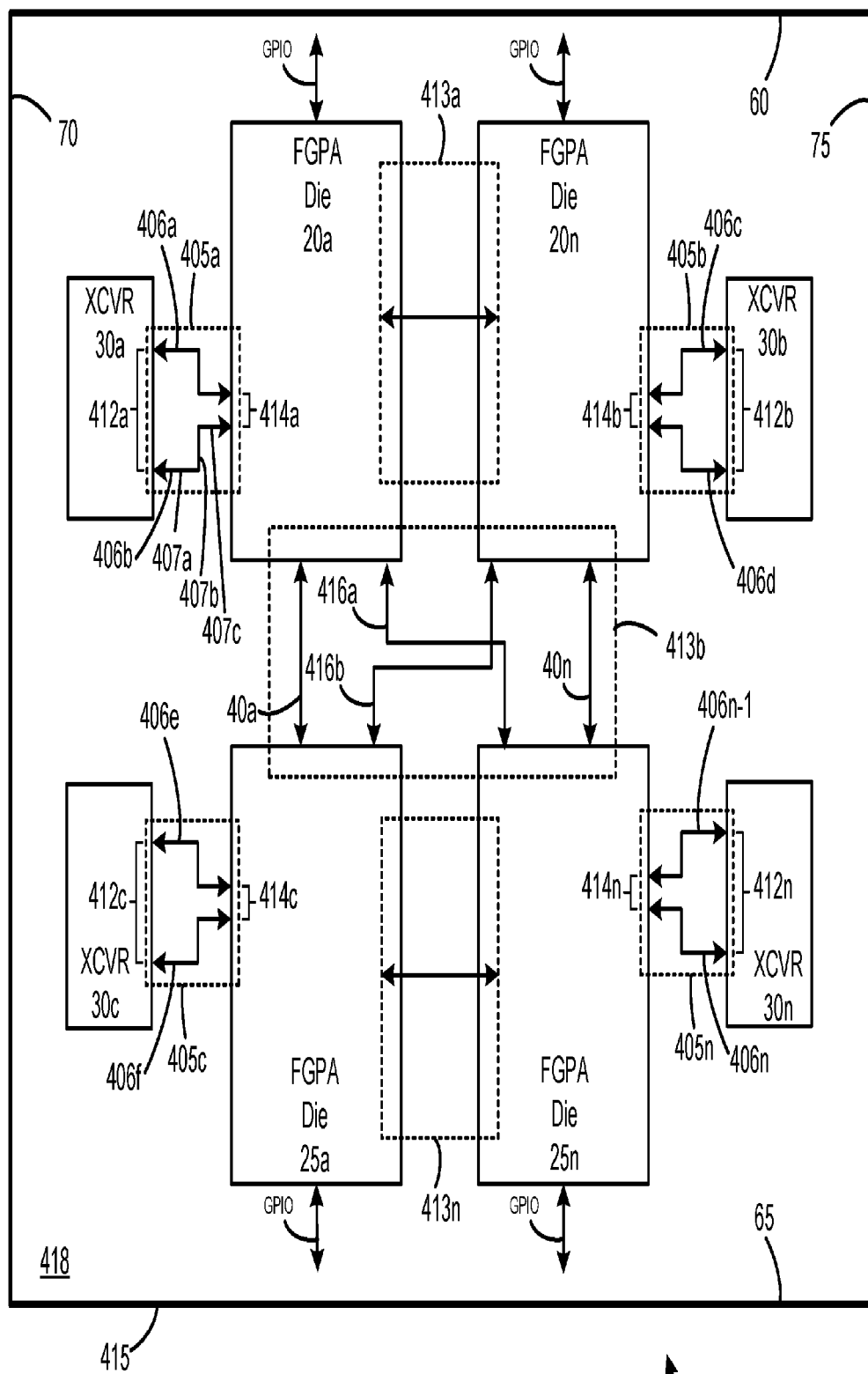
FIG. 8 illustrates a top view of a semiconductor device that includes an IC package that houses a number of IC dies, which are connected by one or more interconnect bridges where the bridges compensate for pitch differences of the solder bumps of the dies, in an embodiment.

FIG. 8 illustrates a top view of a semiconductor device 400 that includes an IC package 415 that houses a number of IC dies, in an embodiment. The top view of the semiconductor device shows the device without a top and with the die visible in the package. The semiconductor device may be a SiP device, a multi-chip module, a multi-die assembly, a system-on-package device, and other multi-die devices.

Semiconductor device 400 is similar to semiconductor devices 10, 100, 200, and 300, but differs in that one or more of the interconnect bridges (e.g., EMIB elements 405a, 405b, 405c . . . 405n) of the package substrate 418 includes electrical traces (e.g., electrical traces 406a, 406b, 406c, 406d, 406e, 406f . . . 406n-1, 406n) that allow for dies (e.g., FPGA and XCVR dies) connected by the EMIB element to have different IO (e.g., solder bumps, solder balls, pins, or others) pitches. Specifically, a first die (e.g., XCVR die 30a) may have a first pitch (e.g., pitch 412a) between IOs and a second die (e.g., FPGA die 20a) may have a second pitch (e.g., pitch 414a) between IOs where the first pitch is different from (e.g., less than) the second pitch. An interconnect bridge (e.g., EMIB 405a) that connects the first and second dies includes electrical traces that fan out to connect IOs on the first die to IOs on the second die. The electrical traces fan out from the IOs having a first pitch to IOs having a second pitch where the first pitch is less than the second pitch. The electrical traces within the interconnect bridge fan out so that the electrical traces do not cross and the ends of the electrical traces have the described pitches. That is, the ends of the electrical traces at a first side of the interconnect bridge have first pitch 412a and the ends of the electrical traces at a second side of the interconnect bridge have the second pitch 414a.

Figure 9:
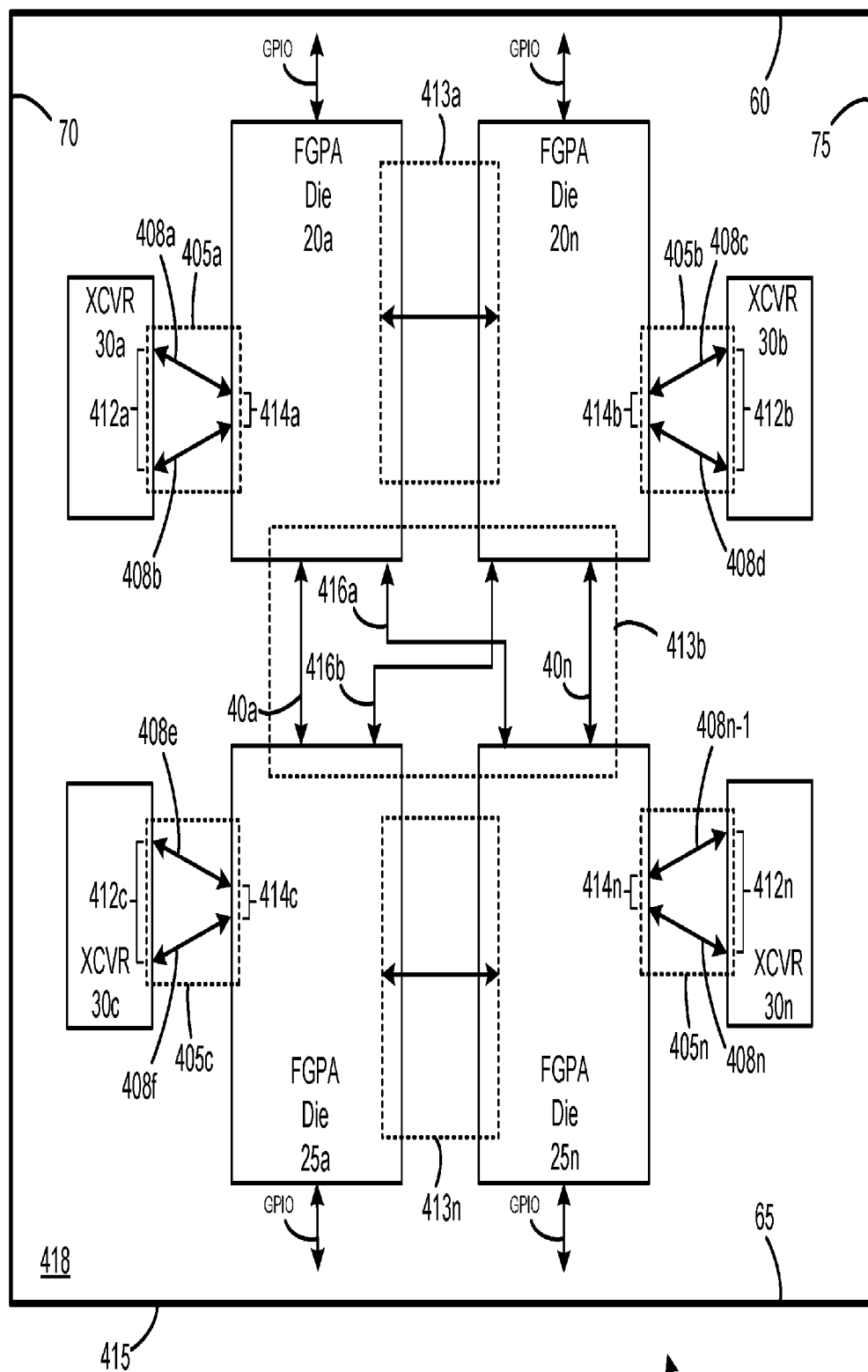
FIG. 9 illustrates an embodiment where the electrical traces of a substrate are oblique traces and the oblique traces are not perpendicular and are not parallel with respect to the vertical and horizontal traces of the substrate, in an embodiment.

FIG. 9 illustrates an embodiment where the electrical traces (e.g., electrical traces 408a, 408b, 408c, 408d, 408e, 408f . . . 408n-1, 408n) are oblique electrical traces and where the oblique electrical traces are not perpendicular and are not parallel with respect to vertical and horizontal electrical traces of the package substrate, in an embodiment. In an embodiment, the oblique electrical traces are not perpendicular and are not parallel with respect to the sides of the interconnect bridge comprising the oblique electrical traces. That is, the oblique electrical traces are diagonally oriented with respect to the sides of the interconnect bridge. The oblique electrical traces are approximately straight within the interconnect bridge and are not parallel. In an alternative embodiment, each electrical trace within the interconnect bridge has a curved shape.

Referring again to FIG. 8, one or more traces have a step shape so that the ends of the electrical traces have the first and second pitches. Each electrical trace may have a first section 407a and second section 407b, where the first and second sections are perpendicularly arranged with respect to each other. Each electrical trace may be a third section 407c, where the second and third sections are perpendicularly arranged with respect to each other. The perpendicular arrangements of the sections of the electrical traces form an offset (e.g., step) that form the different pitches of the ends of electrical traces at the different ends of the electrical traces and at the opposite sides of the interconnect bridge.

One or more of the interconnect bridges (e.g., EMIB elements 405a, 405b, 405c . . . 405n) of semiconductor device 400 may have first pitches (e.g., first pitches 412a, 412b, 412c . . . 412n) that are the same and second pitches (e.g., second pitches 414a, 414b, 414c . . . 414n) that are the same. The first and second pitches match the IO pitches of the die that the interconnect bridges connect. Alternatively, one or more of the interconnect bridges may have different first pitches (e.g., first pitches 412a and 412b different) and different second pitches (e.g., second pitches 414a and 414b different) where the first and second pitches match the IO pitches of the die that the interconnect bridges connect.

Referring to FIGS. 8 and 9, one or more of the interconnect bridges (e.g., EMIB element 413b) may have step electrical traces (416a and 416b) where the step electrical traces connect two dies that are in different rows of dies and in different columns of dies, in an embodiment. The step electrical traces may be step-cross traces where the electrical traces are in different layers of electrical traces in the interconnect bridge and a portion of one of the electrical traces is above a portion of the other electrical trace. Traces 416a and 416b shown in FIG. 8 are step-cross traces.

In an alternative embodiment, one or more of the electrical traces in one or more of the interconnect bridges (e.g., element 413b) are oblique electrical traces that connect one or more dies that are in different rows of dies and in different columns of dies. While the foregoing description describes the inclusion of a relatively small number of electrical traces in the interconnect bridges, an interconnect bridge may have more electrical traces.

Figure 10:
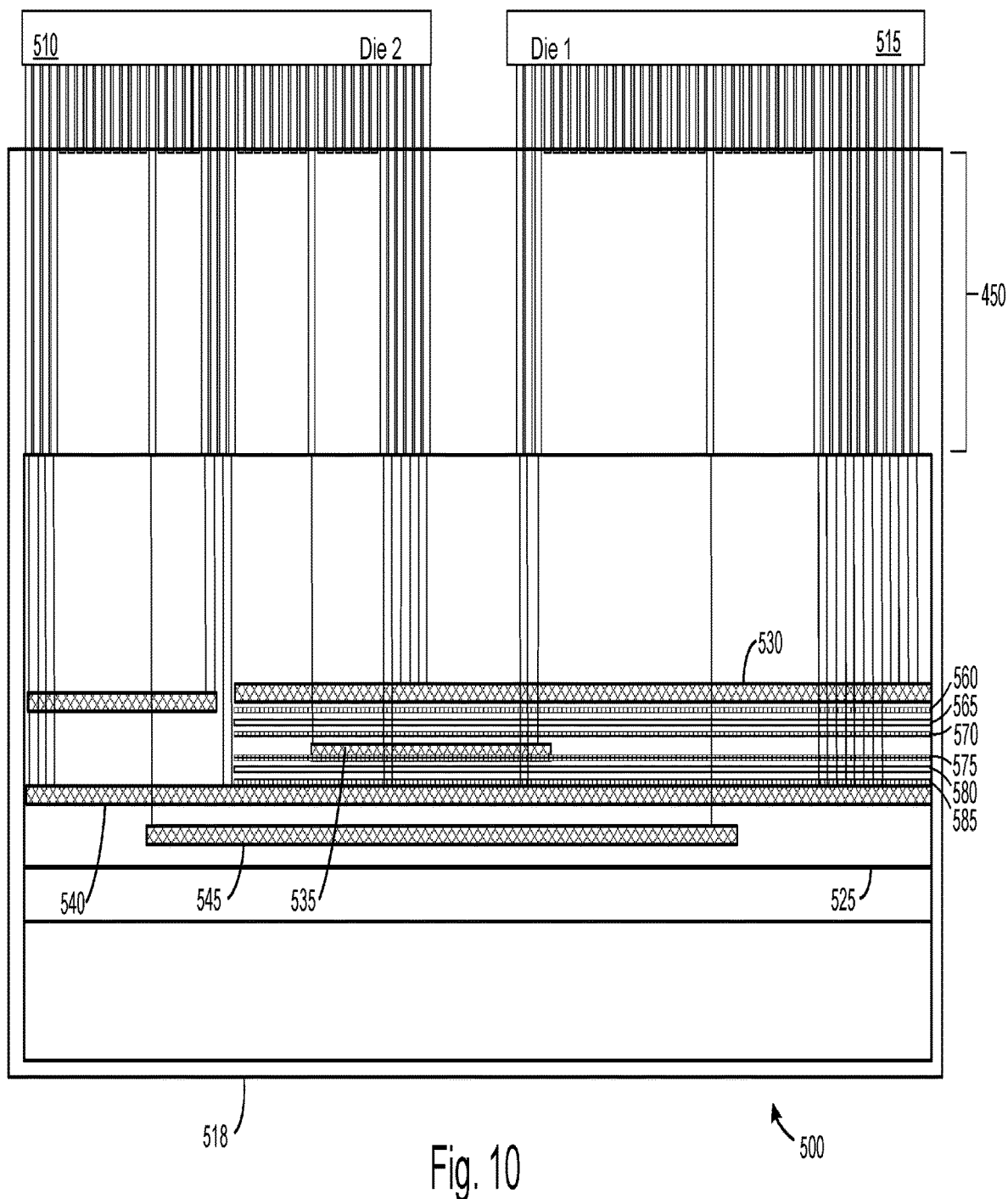
FIG. 10 illustrates a cross-sectional view of a semiconductor device having an interconnect bridge that includes one or more layers of metal-insulator-metal (MIM) capacitors where at least one MIM cap may be mirrored by another MIM cap between metal layers of the interconnect bridge, in an embodiment.

FIG. 10 illustrates a cross-sectional view of a semiconductor device 500, in an embodiment. Semiconductor device 500 includes at least first and second IC dies 510 and 515 mounted on a package substrate 518. The semiconductor device includes more IC dies in alternative embodiments. The package substrate includes an interconnect bridge 525 (e.g., an EMIB element) that connects the dies and provides power distribution and ground to the dies.

The interconnect bridge includes at least four bridge layers 530, 535, 540, and 545 that each includes an electrical trace. The electrical traces are metal layers. Plated vias 450 formed in a top layer of the package substrate electrically connect the IOs (e.g., solder bumps, solder balls, pins, or others) of the dies to the interconnect bridge. The interconnect bridge includes a number of vertical conductors that connect the vias to the metal layers.

The four bridge layers are stacked layers with bridge layer 530 being the top bridge layer and bridge layer 535 being the next lower bridge layer below top bridge layer 530. Bridge layer 540 is the next layer below the layers 530 and 535. Bridge layer 545 is the lowest bridge layer and is below bridge layers 530, 535, and 540.

The four bridge layers may include signal distribution layers, power distribution layers, ground layers, or other types of layers. For example, bridge layers 535, 540, and 545 may be for signal transfer between dies 1 and 2 and bridge layer 530 may be a power distribution layer. In an embodiment, die 1 supplies power to die 2 via bridge layer 530.

In an embodiment, the interconnect bridge includes three layers of material 560, 565, and 570 located between the top bridge layer 530 and the next lower bridge layer 535. Layer 560 is a metal layer, layer 565 is an insulator layer, and layer 570 is a metal layer. Layers 560, 565, and 570 form a first metal-insulator-metal (MIM) capacitor between bridge layers 530 and 535.

In another embodiment, the interconnect bridge includes three layers of material 575, 580, and 585 located between bridge layers 535 and 540 and located between bridge layers 530 and 540. Layer 575 is a metal layer, layer 580 is an insulator layer, and layer 585 is a metal layer. Layers 575, 580, and 585 form a second MIM capacitor. The second MIM capacitor is between bridge layers 535 and 540 and is between bridge layers 530 and 540.

The first and second MIM capacitors may smooth the power fluctuations between the bridge layer (e.g., bridge layer 530) that deliver power from die 1 to die 2 and ground (e.g., bridge layer 535). The first and second MIM capacitors may add additional capacitance to MIM capacitors in the dies and to MIM capacitors mounted on the package substrate so that efficient power may be delivered between the dies. The first and second MIM capacitors facilitate the efficient delivery of power by reducing power fluctuations on the power distribution bridge layer. Limiting power delivery between the dies due to fluctuations in the power has the potential to lower the performance of semiconductor device 500, which may be improved via the first and second MIM capacitors located in the interconnect bridge of the package substrate.

Figure 11:
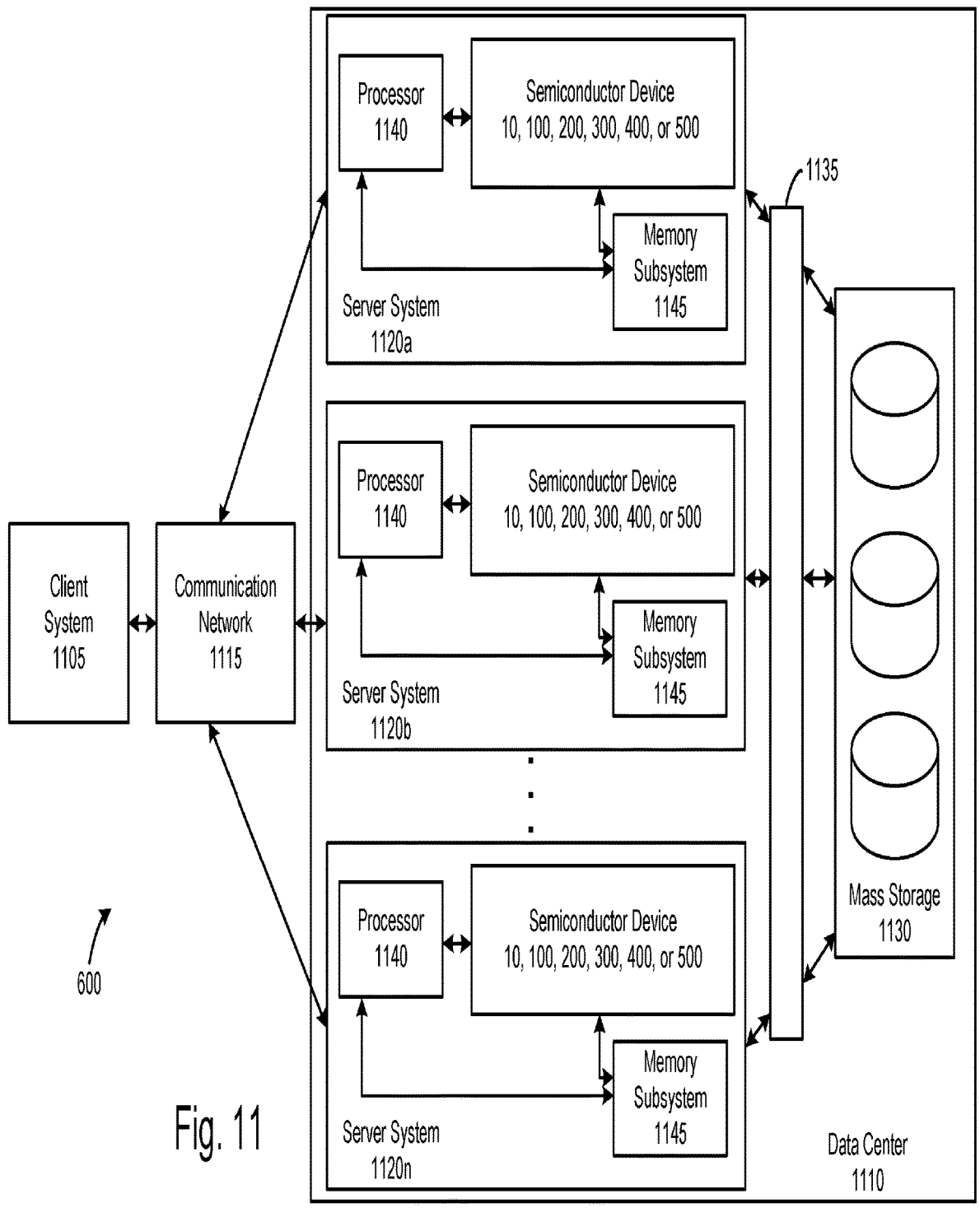
FIG. 11 illustrates a data center system that includes one of the described semiconductor devices, in an embodiment.

FIG. 11 illustrates a data system 1100, in an embodiment. Data system 1100 includes a client system 1105 that is adapted to access a data center 1110 using a communication network 1115. The client system 1105 may include one or more client computers that are adapted to access data stored in the data center. The client system may include a server, a desktop computer, a laptop computer, a mobile device (e.g., a tablet computer, a smartphone, or other devices), any combination of these devices, or other devices. The client system may transfer data to the data center for storage in the data center, retrieve data from the data center, or request alteration of data in the data center. Communication network 1115 may include one or more networks, such as the Internet, one or more intranets, or other network systems.

Data center 1110 includes one or more servers, such as servers 1120a, 1120b . . . 1120n, mass storage 1130, an IP switch 1135, and may include other elements. Mass storage 1130 includes one or more types of memory devices, such as a disk array that includes a number of disk memory devices (e.g., magnetic disk memory), optical storage (e.g., optical disk storage), solid state memory, tape memory, and others. The memory devices may be located in one or more data center racks, which include one or more of the servers, the IP switch, both, or do not include the servers and the IP switch. The IP switch routes communication packets between the servers and the memory devices of the mass storage.

Each server includes one or more processors 1140, one or more semiconductor devices 10, 100, 200, 300, 400, and 500 (described above), a memory subsystem 1145, and other devices. In each server, a first processor 1140 included in the server may communicate with a second processor 1140 in the server using a bus structure and a bus communication standard, such as the UltraPath Interconnect (UPI) standard for point-to-point processor interconnect or may use a different communication standard. The processor and semiconductor device of a server may communicate using a bus structure and a bus communication standard, such as the peripheral component interconnect express (PCIe) standard. The processor, semiconductor device, or both may communicate with the memory subsystem at a single data rate (SDR), double data rate (DDR), or quad data rate (QDR) in half or full duplex mode. The memory subsystem may include DDR non-volatile memory, 3D xPoint non-volatile memory, or other types of memory.

In an embodiment, each semiconductor device (e.g., semiconductor device 10, 100, 200, 300, 400, or 500 described above) is located on a PCB (e.g., a PCI card) where the PCB is configured to be inserted and held in a PCI or PCIe slot of a server. In some embodiments, one or more servers include a number of semiconductor devices 10, 100, 200, 300, 400, or 500, which may be positioned a number of PCB cards that are located in a server's PCI or PCIe slots.

In each server, the processor, semiconductor device, and memory subsystem are located on a single sled in a data center rack, are distributed among two or more sleds in a data center rack, or are distributed among a number of sleds in a number of data center racks. That is, each server is a consolidated server (e.g., components in a single sled and in a single data center rack) or a distributed server (e.g., components in multiple sleds in a single data center rack, or components in multiple sleds and in multiple data center racks). Distributing components of a server among sleds, data center racks, or both may facilitate relatively fast communication between the components by positioning select components in frequent communication relatively close to each other. For example, in a server where the processor accesses the memory subsystem more frequency than the semiconductor device, the processor and memory subsystem may be located relatively close (e.g., on a first sled) in a data center rack and the semiconductor device may be located farther from the memory subsystem (e.g., on a different second sled) in the data center rack. Alternatively, the second sled may be positioned nearer the mass storage than the first sled, for example, if the semiconductor device accesses the mass storage with a higher frequency than the processor.

In an embodiment, the memory subsystems of a number of servers may be located on a single sled (e.g., a sled that is located at about the center of a data center rack) and the processors and semiconductor devices may be located on one or more different sleds located above and below the center sled. Such configuration may facilitate relatively fast access to the memory subsystem particularly if the memory subsystems are accessed by multiple servers.

In the data center, an FPGA of the semiconductor device in combination with one or more other devices (e.g., another FPGA, an ASIC, a processor, or another device) on the semiconductor device facilitate the acceleration one or more functions that may be offloaded from a processor 1140 to the FPGA. For example, the FPGA operating as an accelerator may be configured to perform massively parallel, real-time processing functions that may be offloaded from the processor to the FPGA and performed faster than the processor. Example massively parallel, real-time processing functions include massively parallel, real-time data checking, data conversion, data processing, video processing, frame grabbing, image enhancement of grabbed frames, erosion filtering, dilation filtering, encryption, decryption, data extraction from a long word, or other functions performed on relatively small portions of data that can be operated on in parallel at higher rates of operation compared to the processor.

A combination of benefits is provided in the data center due to semiconductor device (e.g., 10, 100, 200, 300, 400, or 500) such as reduced latency of signal propagation between IC dies of the semiconductor device due to reducing hops that the signals take and reduced footprint of the dies. In the data center where the number of interactions between components is relatively large, a reduction in latency increases overall throughput of data.

Figure 12:
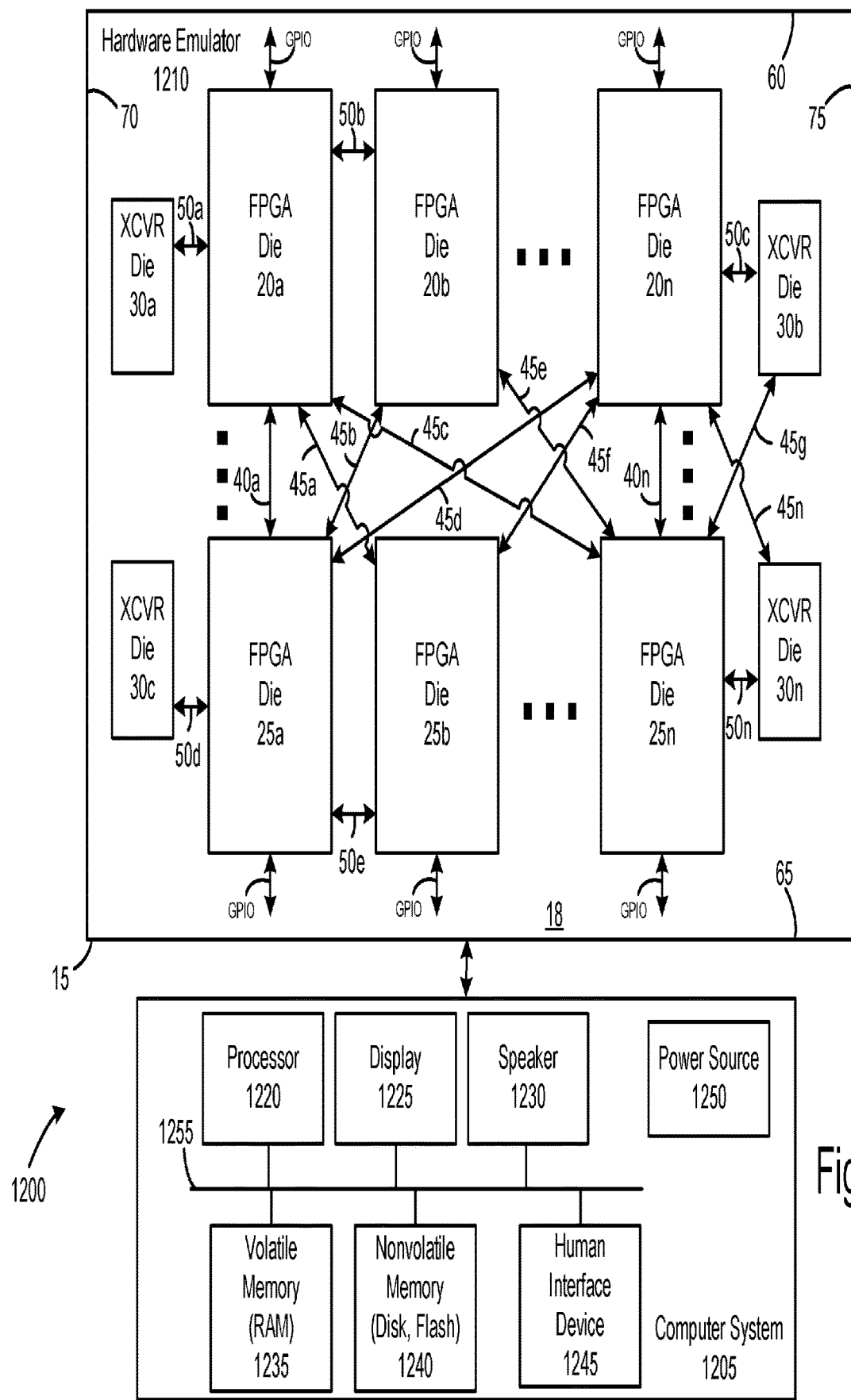
FIG. 12 illustrates an emulation system that includes a computer system and a hardware emulator, in an embodiment.

FIG. 12 illustrates an emulation system 1200 that includes a computer system 1205 and a hardware emulator 1210, which may include one or more semiconductor devices, such as devices 10, 100, 200, 300, 400, or 500 in any combination. The hardware emulator is an emulator that takes the form of a hardware device that emulates another device. The hardware emulator, for example, may emulate an electronic device, such as a printer, a scanner, a camera, a one or more types of processors, a computer, a game console, a tablet computer, a smartphone, a television, a medical device, an electronic system of a vehicle (e.g., car, airplane, motorcycle, or others), a home appliance, a meter, such as a gas meter, a router, or other devices.

The computer system 1205 may be a personal computer, a laptop computer, a server, a tablet computer, a custom computer system, such as a custom computer system adapted for testing the emulator, or other computer types. The computer system may include a processor 1220, a display 1225, a speaker 1230, a volatile memory 1235, a nonvolatile memory 1240, a human interface device 1245, a power source 1250, one or more busses 1255 that link the components, any combination of these components, or other additional components. The computer system may link to the hardware emulator via a wired or a wireless communication link. The wired communication link may include, for example, one or more of USB, Ethernet, serial RS-232, parallel DB25, eSATA, displayport, HDMI, an optical link, PCI, PCIe, or others. The wireless communication link may include, for example, one or more of an RF link (e.g., Bluetooth, Wi-Fi, or others), an IR link, or others.

The hardware emulator may include one or more IC dies, such as FPGAs 20a-20n and 25a-25n, one or more transceivers, such as transceivers 30a-30n, and one or more vertical, horizontal, and oblique electrical traces that interconnect the dies. The hardware emulator may include other circuits, such as a processor, memory, a network interface device, a USB hub and port, a PCIe connector, a complex programmable logic device (CPLD), an ASIC, or any combination of these devices. The circuits (e.g., FPGAs, ASIC, processor, or others described above) of the hardware emulator may form a portion the circuits of one or more semiconductor devices 10, 100, 200, 300, 400, or 500 described above.

One or more of the FPGAs are configurable for emulating one or more devices, such as the emulated devices listed above. The FPGAs may be configured to emulate a device using a hardware description language, such as HDL, to configure the logic array block of the FPGA.

A variety of benefits are provided in a hardware emulator due to the electrical trace configurations that link the dies of the emulators. The benefits provided are similar to those described above with respect to the data center benefits.

In an embodiment, an integrated circuit includes a package substrate that in turn includes a first electrical trace and a second electrical trace. The integrated circuit further includes first, second, third, and fourth configurable IC dies (or "configurable dies"), which are mounted on the package substrate. The first and second configurable dies are arranged in a first row. The third and fourth configurable dies are arranged in a second row, which is approximately parallel to the first row. The first and third configurable dies are arranged in a first column. The second and fourth configurable dies are arranged in a second column, which is approximately parallel to the first column. The first electrical trace couples the first and third configurable dies, and the second electrical trace couples the second and third configurable dies. The second electrical trace is oblique with respect to the first electrical trace.

The package substrate may include a third electrical trace that couples the first and fourth configurable dies, and the third electrical trace is oblique with respect to the first electrical trace. A portion of the second electrical trace is above a portion of the third electrical trace.

The first row may include a fifth configurable die positioned between the first and second configurable dies and the second row includes a sixth configurable die positioned between the third and fourth configurable die. The package substrate may include an interconnect bridge that includes the second and third electrical traces.

The package substrate may include a fourth electrical trace that couples the first and second configurable dies and the second and third electrical traces may be oblique with respect to the fourth electrical trace. The first electrical trace may be perpendicular with respect to the fourth electrical trace.

The package substrate may include a fifth electrical trace that couples the third and fourth configurable dies. The second and third electrical traces may be oblique with respect to the fifth electrical trace. The first electrical trace may be perpendicular with respect to the fifth electrical trace.

The package substrate includes a sixth electrical trace that couples the second and fourth configurable dies. The second and third electrical traces are oblique with respect to the sixth electrical trace.

In an embodiment, an integrated circuit includes a package substrate that in turn includes an interconnect bridge and first and second electrical traces where the first and second electrical traces are located in the interconnect bridge.

The integrated circuit includes a first configurable die that is mounted on the package substrate and includes first IO package bump and a second IO package bump having a first pitch. The integrated circuit includes a second configurable die that is mounted on the package substrate and includes a third IO package bump and a fourth IO package bump having a second pitch. The first and second pitches are different pitches. The first electrical trace couples the first and third IO package bumps, and the second electrical trace couples the second and fourth IO package bumps.

The first electrical trace includes a first turn and a second turn in a lateral plane of the interconnect bridge, and the second electrical trace includes a third turn and a fourth turn in the lateral plane of the interconnect bridge. The first, second, third, and fourth turns may be perpendicular turns. A portion of the first electrical trace is below a portion of the second electrical trace in the interconnect bridge. The first electrical trace includes a first vertical portion below the first bump and a second vertical portion below at the third bump, and the second electrical trace includes a third vertical portion below the second bump and a fourth vertical portion below the fourth bump.

In an embodiment, an integrated circuit package includes a package substrate comprising that in turn includes interconnect bridge that is adapted for coupling at least a first die and a second die when the first and second dies are mounted on the package substrate. The interconnect bridge includes a first metal layer that is a power plane adapted to transfer power from the first die to the second die when the first and second dies are mounted on the package substrate and are coupled by the first metal layer. The interconnect bridge includes a second metal layer that is a second electrical pathway between the first and second dies when the first and second dies are mounted on the package substrate and are coupled by the second metal layer. The interconnect bridge includes a first metal-insulator-metal capacitor that is located between the first and second metal layers.

The interconnect bridge may include a second metal-insulator-metal capacitor. The interconnect bridge may include a third metal layer that is a third electrical pathway between the first and second dies when the first and second dies are mounted on the package substrate and are coupled by the third metal layer. The second metal layer is located between the first and third metal layers, and the second metal-insulator-metal capacitor that is located between the second and third metal layers.

The first metal-insulator-metal capacitor may include a fourth metal layer located between the first and second metal layers, a fifth metal layer located between the first and second metal layers, and an insulator layer located between the first and second metal layers and located between the fourth and fifth metal layers. The second metal-insulator-metal capacitor may include a sixth metal layer located between the second and third metal layers, a seventh metal layer located between the second and third metal layers, and an insulator layer located between the second and third metal layers and located between the sixth and seventh metal layers.

This description has been presented for the purposes of illustration and description. It is not intended to be exhaustive or to limit the invention to the precise form described, and many modifications and variations are possible in light of the teaching above. For example, while SiP devices have been described above, embodiments described may be applied to a variety of multi-chip modules, multi-die assemblies, system-on-package devices, and other multi-die devices. Further, various embodiments described may be included in the Stratix 10 based application specific integrated circuit (ASIC) and emulation product for this circuit. The embodiments were chosen and described in order to best explain the principles of the embodiments and their practical applications. This description will enable others skilled in the art to best utilize and practice the invention in various embodiments and with various modifications as are suited to a particular use. The scope of the invention is defined by the following claims.

What is claimed is:

1. An integrated circuit device comprising:
an interposer comprising a first electrical trace and a second electrical trace;
a first die, coupled to the interposer, comprising a first plurality of package bumps; and
a second die, coupled to the interposer, comprising a second plurality of package bumps, wherein the first plurality of package bumps has a first closest pitch between package bumps of the first plurality of package bumps and the second plurality of package bumps has a second closest pitch between package bumps of the second plurality of package bumps, the first closest pitch is shorter than the second closest pitch, the first electrical trace couples a first package bump of the first plurality of package bumps with a second package bump of the second plurality of package bumps, and the second electrical trace couples a third package bump of the first plurality of package bumps with a fourth package bump of the second plurality of package bumps.

2. The integrated circuit device of claim 1, wherein the first die comprises a first die type, and the second die comprises a second die type.

3. The integrated circuit device of claim 1, comprising a memory device.

4. The integrated circuit device of claim 1, comprising a processor.

5. The integrated circuit device of claim 1, comprising a package substrate coupled to the interposer.

6. The integrated circuit device of claim 5, wherein the interposer is vertically above at least part of the package substrate.

7. The integrated circuit device of claim 6, wherein at least a portion of the first and second plurality of package bumps are above the interposer.

8. The integrated circuit device of claim 7, wherein the package substrate is coupled to a plurality of ball grid array bumps.

9. The integrated circuit device of claim 8, wherein the plurality of ball grid array bumps are disposed on a first face of the package substrate opposite of a second face proximal to the interposer.

10. The integrated circuit device of claim 1, wherein the first plurality of package bumps comprises input-output package bumps.

11. The integrated circuit device of claim 1, wherein the second plurality of package bumps comprises an input-output package bumps.

12. The integrated circuit device of claim 1, wherein the interposer comprises an interconnect bridge.

13. An integrated circuit device comprising:
a first electrical trace;
a second electrical trace;
a first die, coupled to the first electrical trace and the second electrical trace, comprising a first plurality of package bumps; and
a second die, coupled to the first electrical trace and the second electrical trace, comprising a second plurality of package bumps, wherein the first plurality of package bumps and the second plurality of package bumps have different pitches, the first electrical trace couples a first package bump of the first plurality of package bumps with a second package bump of the second plurality of package bumps, and the second electrical trace couples a third package bump of the first plurality of package bumps with a fourth package bump of the second plurality of package bumps.

14. The integrated circuit device of claim 13, comprising an interposer comprising the first electrical trace and the second electrical trace.

15. The integrated circuit device of claim 13, comprising a package substrate.

16. The integrated circuit device of claim 15, wherein the first electrical trace and the second electrical trace are located between the first die and the package substrate.

17. An integrated circuit device comprising:
a first electrical trace;
a second electrical trace;
a first die, coupled to the first and second electrical traces, comprising a first plurality of package bumps; and
a second die, coupled to the first and second electrical traces, comprising a second plurality of package bumps, wherein the first plurality of package bumps in a first two-dimensional array and the second plurality of package bumps in a second two-dimensional array, the first two-dimensional array of package bumps having a first pitch in a first dimension of the first two-dimensional array being different than a second pitch of the second two-dimensional array, the first electrical trace couples a first package bump of the first plurality of package bumps with a second package bump of the second plurality of package bumps, and the second electrical trace couples a third package bump of the first plurality of package bumps with a fourth package bump of the second plurality of package bumps.

18. The integrated circuit device of claim 17, wherein the integrated circuit device comprises an interposer comprising the first and second electrical traces.

19. The integrated circuit device of claim 18, wherein the interposer comprises an interconnect bridge.

20. The integrated circuit device of claim 17, comprising a package substrate, wherein the first electrical trace and the second electrical trace are located between the first die and the package substrate.

* * * * *